United States Patent [19]

Sun

[11] Patent Number: 5,670,387
[45] Date of Patent: Sep. 23, 1997

[54] PROCESS FOR FORMING SEMICONDUCTOR-ON-INSULATOR DEVICE

[75] Inventor: Shih-Wei Sun, Austin, Tex.

[73] Assignee: Motorola, Inc., Schaumburg, Ill.

[21] Appl. No.: 368,673

[22] Filed: Jan. 3, 1995

[51] Int. Cl.$^6$ ............................................. H01L 21/84
[52] U.S. Cl. .................. 437/21; 437/62; 437/186
[58] Field of Search .......................... 437/62, 974, 31, 437/40, 21, 186

[56] References Cited

U.S. PATENT DOCUMENTS

| | | | |
|---|---|---|---|
| 4,376,286 | 3/1983 | Lidow et al. | 357/23 |
| 4,385,937 | 5/1983 | Ohmura. | |
| 4,490,182 | 12/1984 | Scovell. | |
| 4,593,302 | 6/1986 | Lidow et al. | 357/23.4 |
| 4,704,785 | 11/1987 | Curran | 437/110 |
| 4,837,177 | 6/1989 | Lesk et al. | 437/31 |
| 5,025,304 | 6/1991 | Reisman et al. | 357/71 |
| 5,091,330 | 2/1992 | Cambou et al. | 437/62 |
| 5,141,889 | 8/1992 | Terry et al. | 437/31 |
| 5,323,059 | 6/1994 | Rutter et al. | 257/768 |
| 5,346,848 | 9/1994 | Grupen-Shemansky et al. | 437/61 |
| 5,387,555 | 2/1995 | Linn et al. | 437/225 |
| 5,449,638 | 9/1995 | Hong et al. | 437/61 |
| 5,496,764 | 3/1996 | Sun | 437/67 |
| 5,499,124 | 3/1996 | Vu et al. | 359/59 |

OTHER PUBLICATIONS

Wolf; Silicon Processing for the VLSI ERA, vol. 2: Process Integration; Lattice Press; pp. 70–72 (1990), Month Unknown.

*Primary Examiner*—David Graybill
*Assistant Examiner*—Richard A. Booth
*Attorney, Agent, or Firm*—George R. Meyer

[57] ABSTRACT

Interconnects (22 and 32) are formed within an insulating base material of a first substrate. Trenches (54) and portions of an insulating layer (52) are formed within a second substrate (50). The two substrates are bonded by fusion. The second substrate is polished back to form semiconductor islands (81–83) over the first substrate. Active regions of transistors are formed within the islands (81–83). Conductive plugs (131–134) are made between portions of the active regions and interconnects (22, 32, and 141) that underlie or overlie the semiconductor islands (81–83). Embodiments of the present invention allow higher component density, better thickness control for SOI regions, and lower leakage current compared to SOI layers that use LOCOS-type field isolation.

24 Claims, 5 Drawing Sheets

5,670,387

PROCESS FOR FORMING SEMICONDUCTOR-ON-INSULATOR DEVICE

FIELD OF THE INVENTION

The present invention relates to semiconductor devices, and in particular, to semiconductor-on-insulator devices.

BACKGROUND OF THE INVENTION

Semiconductor-on-insulator (SOI) regions may be formed by bonding substrates together and polishing back a portion of one of the substrates. Thickness control of the substrate being polished back is typically difficult because there is no polish stop. Therefore, the thickness of the silicon layer over the insulator is typically variable from location to location and from substrate to substrate. Also, interconnects are not formed prior to bonding insulating layers of substrates together. High temperatures are required for bonding insulating layers, and many materials used for interconnects cannot withstand these high temperatures without adverse effects including melting, oxidation, metal contamination, or the like. When all interconnects are formed over the active regions, the component density of a device is typically limited.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A semiconductor-on-insulator (SOI) device is formed that includes buried interconnects. The buried interconnects lie within an insulating base material of a substrate. The substrate does not have any transistor active region. In the embodiments below, active regions of transistors and different levels of interconnects are formed to produce a device with a higher component density.

SOI Device

Figure 1:
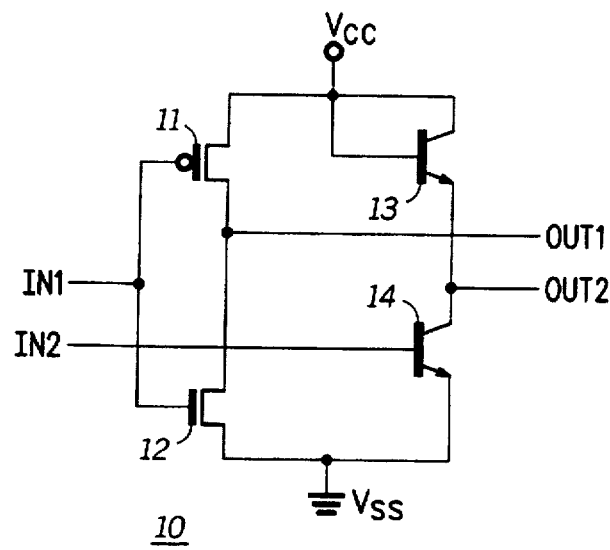
FIG. 1 includes an illustration of a circuit diagram.

FIG. 1 includes an illustration of a circuit schematic diagram of a two-input and two-output SOI device 10. The device includes a p-channel metal-oxide-semiconductor field effect transistor (MOSFET) 11, an n-channel MOSFET 12, and two npn bipolar transistors 13 and 14. A first input (IN1) is coupled to gates of the transistors 11 and 12, and a first output (OUT1) is coupled to drains of the transistors 11 and 12. A second input (IN2) is coupled to a base of transistor 14, a second output (OUT2) is coupled to an emitter of transistor 13 and a collector of transistor 14. A source of transistor 11 and a collector and base of transistor 13 are coupled to VCC, and a source of transistor 12 and an emitter of transistor 14 are coupled to VSS. Transistor 13 is designed to be "weaker" than transistor 14, so that when IN2 is high, the potential of OUT2 is at about the same potential as VSS. The device 10 is formed as an SOI device as described in more detail below.

Figure 2:
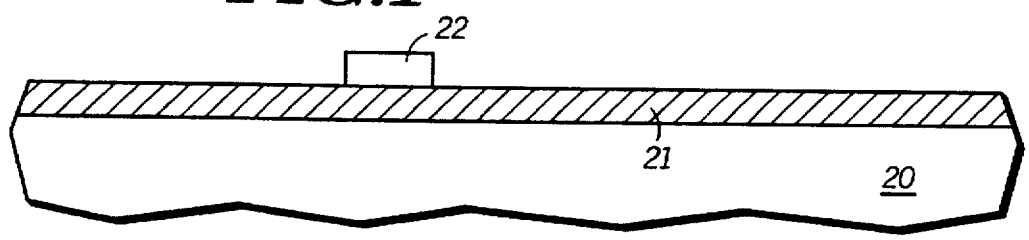
FIG. 2 includes an illustration of a cross-sectional view of a portion of a first semiconductor substrate after forming first-level interconnects over the substrate.

FIG. 2 includes an illustration of a cross-sectional view of a portion of a substrate that has a semiconductor base material 20 and an insulating layer 21 overlying the primary surface of the semiconductor base material 20. The semiconductor base material includes silicon, germanium, III–V semiconductors, or the like. The insulating layer 21 typically includes silicon dioxide, silicon nitride, silicon oxynitride, or the like and is in a range of about 1000–5000 angstroms thick. The thickness of the insulating layer 21 should be sufficient to avoid forming a high capacitance capacitor between subsequently formed interconnects that will overlie the insulating layer 21 and the semiconductor base material 20.

First-level interconnects 22 are formed over the insulating layer 21. Although FIG. 2 illustrates one interconnect 22, other interconnects are formed but are not shown in FIG. 2. Interconnects 22 will be exposed to relatively high temperatures (greater than 600 degrees Celsius). Therefore, interconnect 22 should include material capable of being exposure to these higher temperatures without any adverse effects. The interconnects 22 include doped silicon (polycrystalline or amorphous), a silicide, tungsten, platinum, palladium, ruthenium, rhenium, osmium, iridium, a conductive metal oxide (i.e., $RuO_2$, $ReO_2$, $ReO_3$, $OSO_4$, $IrO_2$), or the like. If oxidation or metal contamination is a concern, the interconnects 22 can be encapsulated within barrier layers including silicon nitride, aluminum nitride, titanium nitride, tungsten nitride, or the like.

Figure 3:
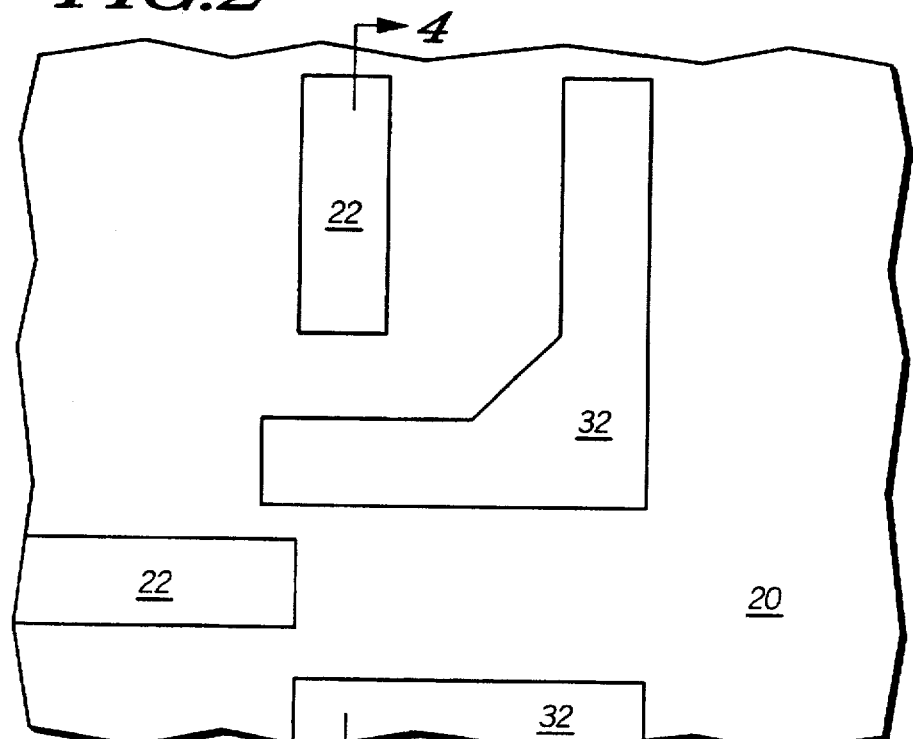
FIGS. 3 and 4 include illustrations of a plan view and a cross-sectional view, respectively, of the substrate of FIG. 2 after forming a second-level interconnect over the substrate.
Figure 4:
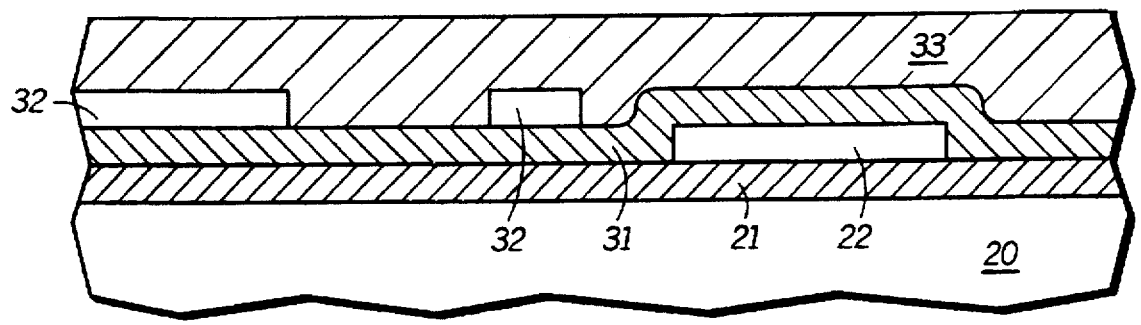

Insulating layer 31, second-level interconnects 32, and another insulating layer 33 are formed over the insulating layer 21 and interconnects 22 as shown in FIGS. 3 and 4. The second-level interconnects 32 are formed at a different elevation compared to the first-level interconnects 22. The interconnects 32 have temperature, oxidation, and metal contamination concerns similar to the interconnects 22. The interconnects 32 typically include any of the materials listed for the interconnects 22, but the interconnects 32 does not necessarily have the same material as interconnects 22. Other second-level interconnects may be formed with interconnects 32 but are not shown in FIGS. 3 and 4.

FIG. 3 includes an illustration of a plan view of the device at this point in the process. Insulating layers are not shown in FIG. 3 to better illustrate the positional relationships between the interconnects 22 and 32. Although not illustrated, the interconnects 22 and 32 may be configured such that some of the interconnects 32 overlap the interconnects 22. FIG. 4 includes an illustration of a cross-sectional view of the device at the sectioning lines 4—4 of FIG. 3.

Figure 5:
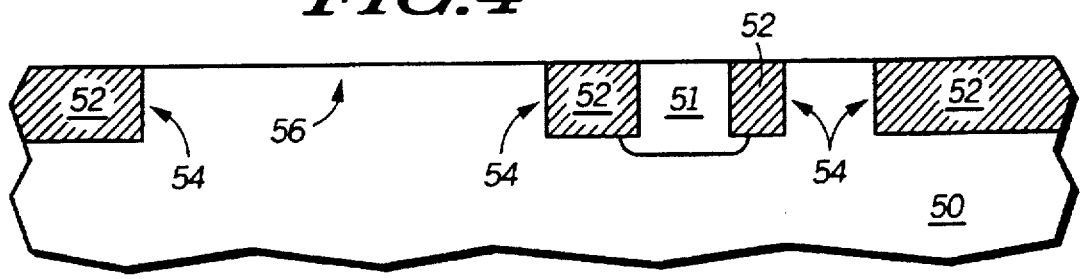
FIG. 5 includes an illustration of a cross-sectional view of a portion of a second semiconductor substrate with a doped region within the substrate and trenches filled with an insulating layer.

A p-type semiconductor substrate 50 has an n-type doped region 51 formed near the primary surface 56 of the substrate 50 as shown in FIG. 5. The semiconductor substrate 50 includes a material listed for the semiconductor base material 20, although substrate 50 and semiconductor base material 20 include the same or different materials. Region 51 includes phosphorus and is diffused into the substrate 50 to a depth of at least 1000 angstroms. After forming the region 51, trenches 54 are formed within the substrate 50 and have vertical walls. The trenches 54 generally are no more than 3000 angstroms deep. Regions 51 lie deeper within the substrate 50 than the trenches 54. The trenches 54 can have nearly any width, but the narrowest trenches 54 are generally are about 0.1 to 1.0 micron wide. The depth of the trenches 54 is in part determined by whether or not the channel regions of the subsequently formed MOSFETs are to be fully depleted or only partially depleted. If channel regions are to be thinner than the depletion region, the trenches 54 should be less than 1000 angstroms deep and possibly only be 500 angstroms deep. Otherwise, the trenches 54 are in a range of about 1000–3000 angstroms deep.

An insulating layer 52 is formed over the substrate 50 and within the trenches 54 as shown in FIG. 5. The insulating layer 52 typically includes silicon dioxide and is generally deposited to a thickness sufficient to fill the trenches 54. Therefore, the insulating layer 52 typically is in a range of about 500–3000 angstroms thick. The portion of the insulating layer 52 that overlies the substrate 50 and doped region 51 outside the trenches 54 is removed by chemical-mechanical polishing or etching until portions of the substrate 50 and doped region 51 are exposed.

Figure 6:
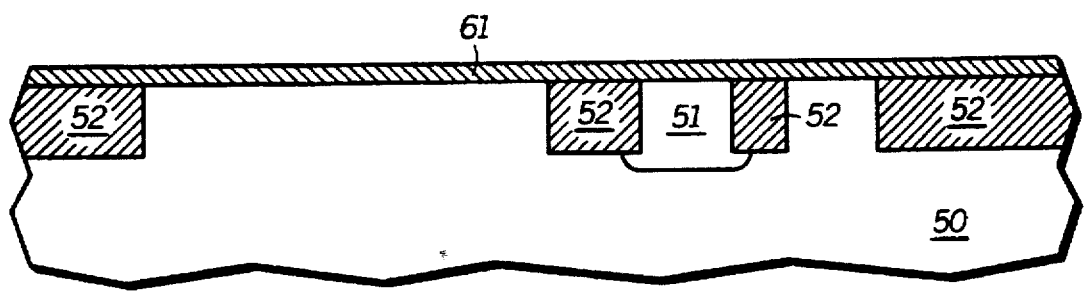
FIG. 6 includes an illustration of a cross-sectional view of the substrate of FIG. 5 after forming an insulating layer over the second substrate and trenches.

After exposing the substrate 50 and doped region 51, a thin oxide layer is formed over all of the substrate 50 or only over the exposed portions of substrate 50 and doped region 51. FIG. 6 includes an illustration of the substrate where a thin insulating layer 61 is formed over the substrate. The oxide layer 61 typically has a thickness less than 200 angstroms and more specifically has a thickness in a range of 50–150 angstroms. The oxide layer 61 is formed by thermal oxidation or a deposition. In an alternate embodiment, the insulating layer 52 is not removed at all or in part over the substrate 50. The insulating layer 52 has dimples above the trenches 54 that can be reflowed to remove the dimples.

Figure 7:
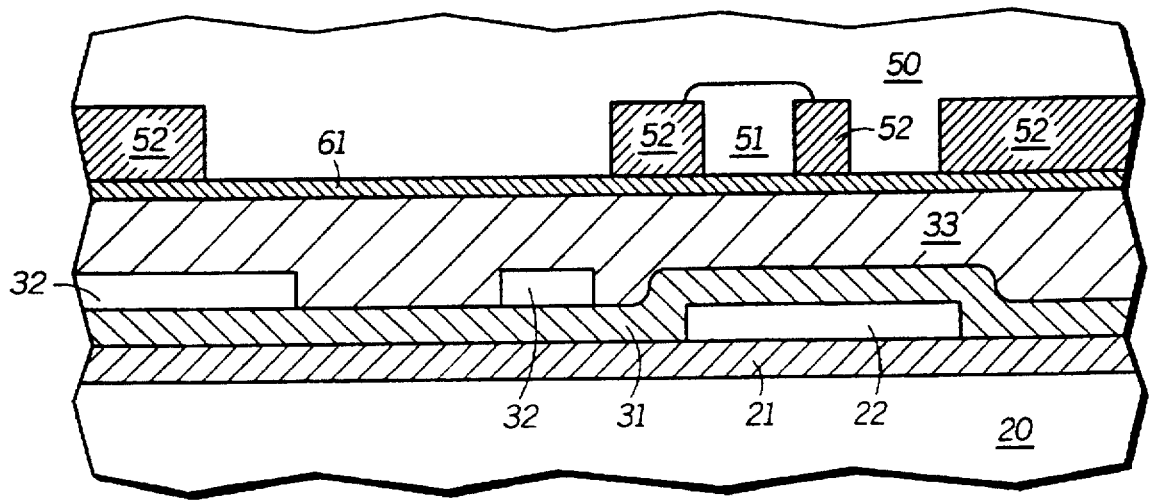
FIG. 7 includes an illustration of a cross-sectional view of the substrates of FIGS. 3 and 6 after bonding the substrates together.

At this point in the process, the substrates are bound together at their insulating and/or oxide layer interfaces as shown in FIG. 7. The bonding is performed by annealing the substrates at a temperature in a range of 1000–1200 degree Celsius for a time in a range of 2–5 hours. The ambient during the anneal typically includes inert gases or oxidizing gases but the ambient does not require both to be present. Many materials that are used for interconnects cannot withstand these bonding conditions without adverse affects. Compare this conditions with alloying conditions that are typically performed in an inert or reducing ambient at a temperature in a range of 350–450 degrees Celsius.

In FIG. 7, the thin oxide layer 61 and insulating layer 33 are fused together. In an alternative embodiment (not shown), the insulating layer 52 and insulating layer 31 are fused together. In a further embodiment, the insulating layer 33 is directly bonded to the substrate 50 and doped region 51. The insulating layer 33 is fused to the insulating layer 52 that lies within the trenches.

Figure 8:
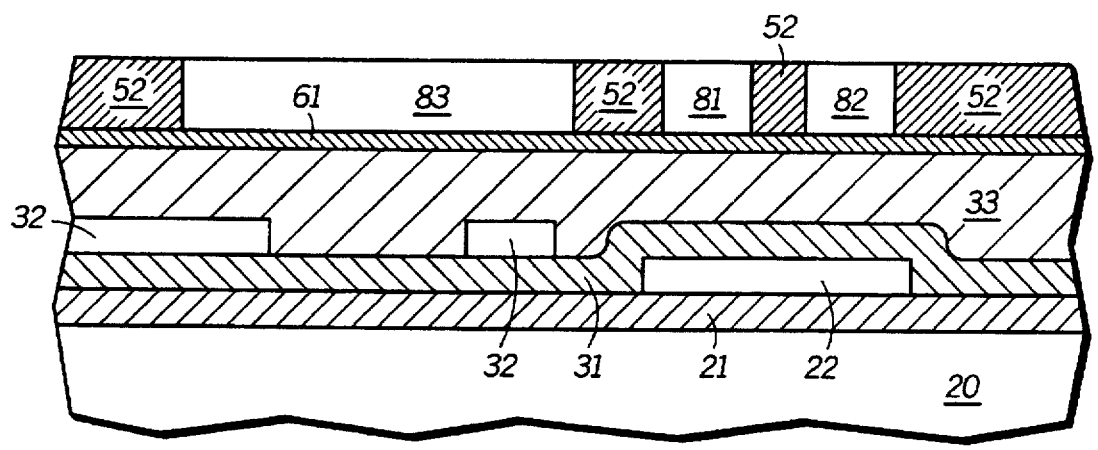
FIG. 8 includes an illustration of a cross-sectional view of the substrate of FIG. 7 after removing most of the second substrate.

The substrate 50 and doped region 51 that extend beyond the trenches are removed to form semiconductor islands 81–83 as shown in FIG. 8. The removal process is typically formed in two different steps. In the first step, a gross polishing step is performed that quickly removes most of the substrate 50. The second step etches the portions of substrate 50 and doped region 51 that remain after the polishing step.

The second step is typically performed as a dry plasma etch, although a wet chemical etch can be used. The dry etching is be performed, so that endpoint detection occurs when the insulating layer 52 within the trenches is reached. The etch is typically extended for a small time period after the endpoint is detected to account for nonuniformities during the polish and etching steps. In another embodiment, the substrate 50 and doped region 51 is chemical-mechanical polished (without any etching) to form the islands 81–83. The insulating layer 52 within the trenches acts as a polish stop.

Monocrystalline semiconductor islands 81–83 subsequently become active regions of the transistors 11–14. Island 81 is lightly n-type doped and includes the active region for the p-channel MOSFET 11, island 82 is lightly p-type doped and includes the active region for the n-channel MOSFET 12, and island 83 is lightly p-type doped and includes the active regions of the bipolar transistors 13 and 14.

As used in this specification, an active region of a transistor is a region in which current flows through the transistor. The active region of a MOSFET includes a source region, a channel region, and a drain region, and the active region of a bipolar transistor includes an emitter region, a base region (intrinsic and extrinsic), and a collector region. As used in this specification, lightly doped means a doping concentration less than 1E17 atoms per cubic centimeter. The remaining portions of the insulating layer 52 are field isolation regions between the islands 81–83.

Figure 9:
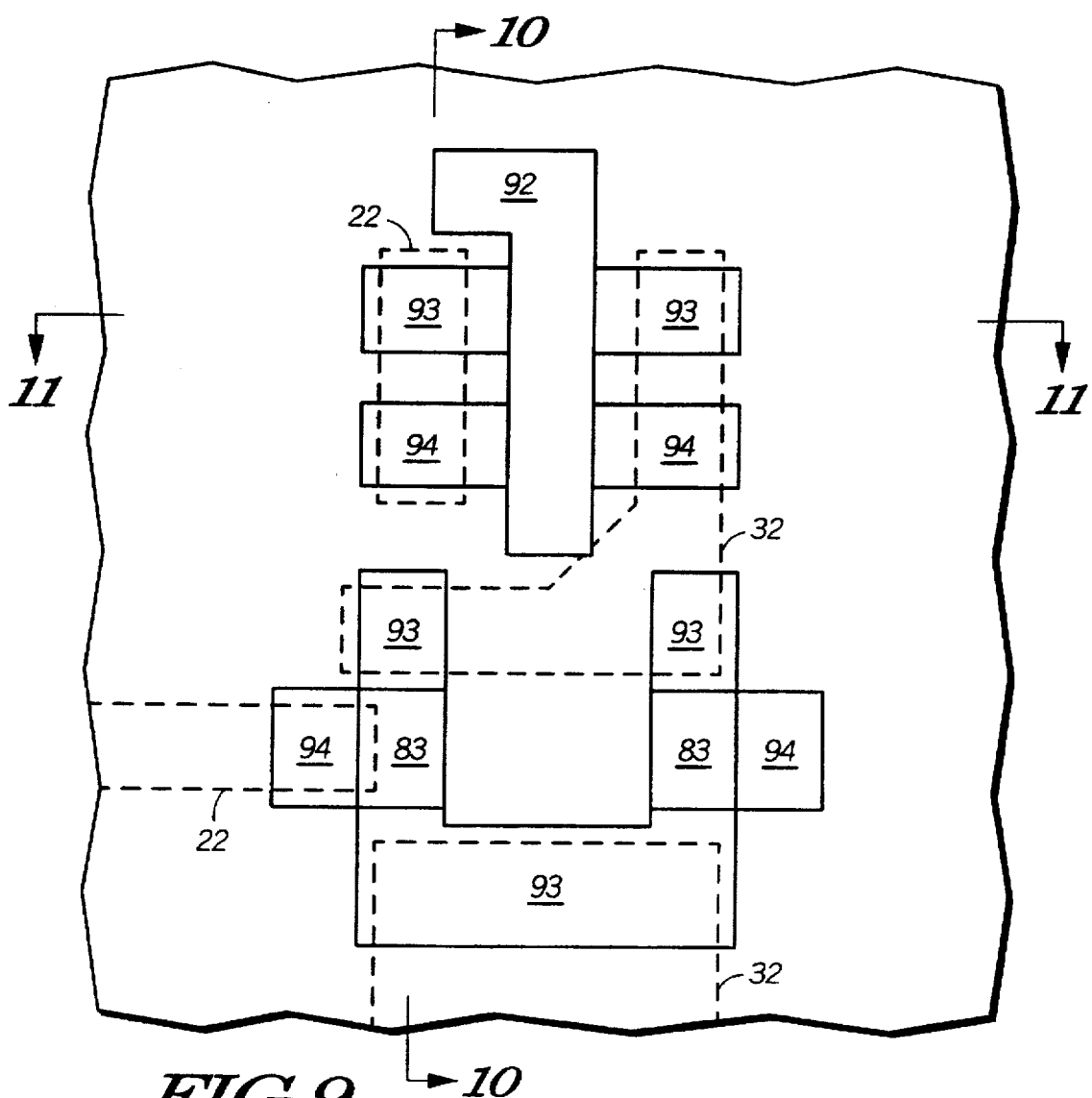
FIGS. 9–11 include illustrations of plan and cross-sectional views of the substrate of FIG. 8 after forming transistors.
Figure 10:
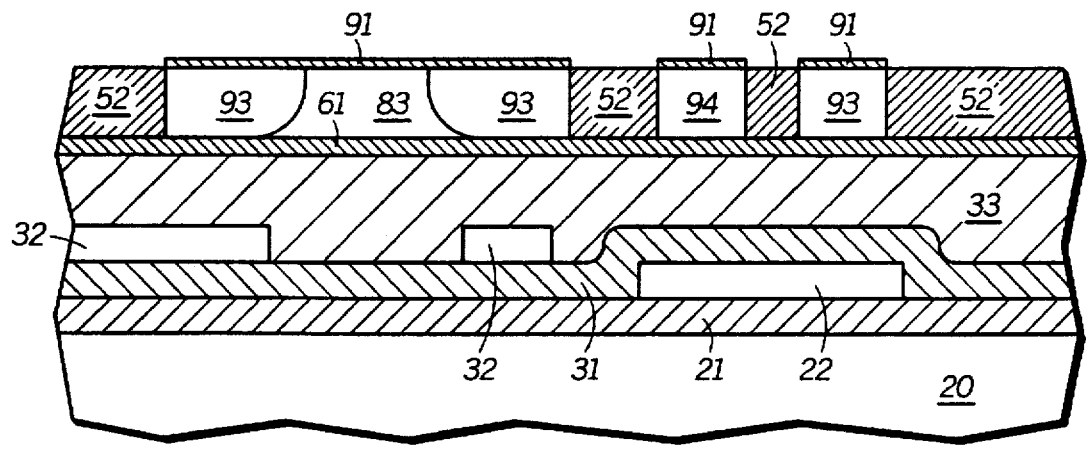
Figure 11:
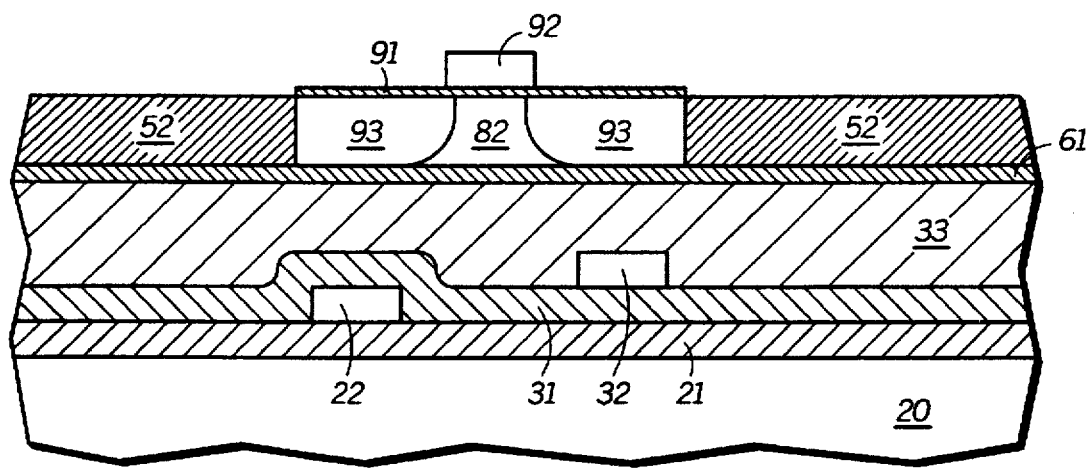

Further processing is performed to form the transistors 11–14. Referring to FIGS. 9–11, a gate dielectric layer 91, a conductive member 92, and heavily doped regions 93 and 94 are formed. The gate dielectric layer 91 includes silicon dioxide, silicon nitride, or a nitrided oxide, and the conductive member 92 includes doped silicon, a metal, or a metal-containing material. Heavily doped regions 93 and 94 have a dopant concentration of at least 1E19 atoms per cubic centimeter. Doped regions 93 include an n-type dopant, such as phosphorus, arsenic, or the like, and doped regions 94 include a p-type dopant, such as boron or the like.

FIG. 9 includes an illustration of a plan view of the device at this point in the process. For simplicity, the insulating and dielectric layers are not shown in FIG. 9. FIG. 9 includes the conductive member 92 that is the gate electrodes for both the p-channel and n-channel MOSFETs 11 and 12. The regions 93 that are adjacent to the conductive member 92 are n-type regions that are source and drain regions for the n-channel MOSFET 12. The regions 94 adjacent to the conductive member 92 are the p-type regions that are source and drain regions for the p-channel MOSFET 11. The active regions of the bipolar transistors 13 and 14 are near the bottom of FIG. 9. The n-type doped regions 93 are collector and emitter regions, lightly p-typed doped regions 83 are intrinsic base regions for the bipolar transistors 13 and 14, and regions 94 that are beside regions 83 are extrinsic base regions for the bipolar transistors 13 and 14.

Interconnects 22 and 32 are illustrated in FIG. 9 by dashed lines. The interconnects 22 and 32 underlie the doped regions 93 and 94. The first-level interconnect 22 closer to the top of FIG. 9 underlies a portion of doped regions 93 and 94. To the right of the conductive member 92 is a second-level interconnect 32 that underlies one of the n-type regions 93, one of the p-type regions 94, and two of the n-type doped regions 93 of the bipolar transistors. Another first-level interconnect 22 underlies one of the regions 94 that lies adjacent to region 83, and another second-level interconnect 32 underlies the doped region 93 nearest the bottom of FIG. 9. The significance of these interconnects will become apparent later when conductive plugs are formed that electrically connect some of the active regions within the monocrystalline semiconductor islands to underlying interconnects. Because transistor 13 is weaker than transistor 14, the left region 83 is typically shorter (regions 93 are closer to each other) and wider than the right region 83. Regions 83 are illustrated to be about the same dimension in FIG. 9 for simplicity.

FIGS. 10 and 11 include illustrations of cross-sectional views of the device as illustrated by the sectioning lines 10—10 and 11—11 in FIG. 9. In FIG. 10, the semiconductor islands lie above insulating layer 61. Within this device the combination of layers 21, 31, and 33 form an insulating base material for the SOI device. Both first-level interconnects 22 and second-level interconnects 32 lie within the insulating base material.

Active regions are seen near the surface in FIG. 10. The left-most active region includes two regions 93 and region 83, which is the part of a semiconductor island that is not doped when doped regions 93 are formed. The left region 93 is a collector region, the region 83 is an intrinsic base region, and the center region 93 is an emitter region. Doped region 94 and the right doped region 93 are drain regions for the MOSFETs 11 and 12, respectively. The gate dielectric layer 91 overlies the semiconductor islands.

FIG. 11 is generally perpendicular to the view seen FIG. 10. The cross-sectional view of FIG. 11 goes through the n-channel MOSFET 12. The left doped region 93 is the drain region, lightly p-type doped region 82 is a channel region, and right doped region 93 is a source region. Region 82 is the part of a semiconductor island that is not doped when doped regions 93 are formed. The active regions of the MOSFETs 11 and 12 have vertical walls.

The gate dielectric layer 91 overlies the source, drain, and channel regions. The conductive member 92 is a gate electrode for the n-channel MOSFET 12 as shown in FIG. 11. The conductive member 92 overlies the region 82 and portions of the regions 93. A first-level interconnect 22 underlies the left doped region 93, and a second-level interconnect 32 underlies the right doped region 93. Once again, the combination of insulating layers 21, 31, and 33 is the insulating base material and interconnects 22 and 32 lie within this insulating base material.

Figure 13:
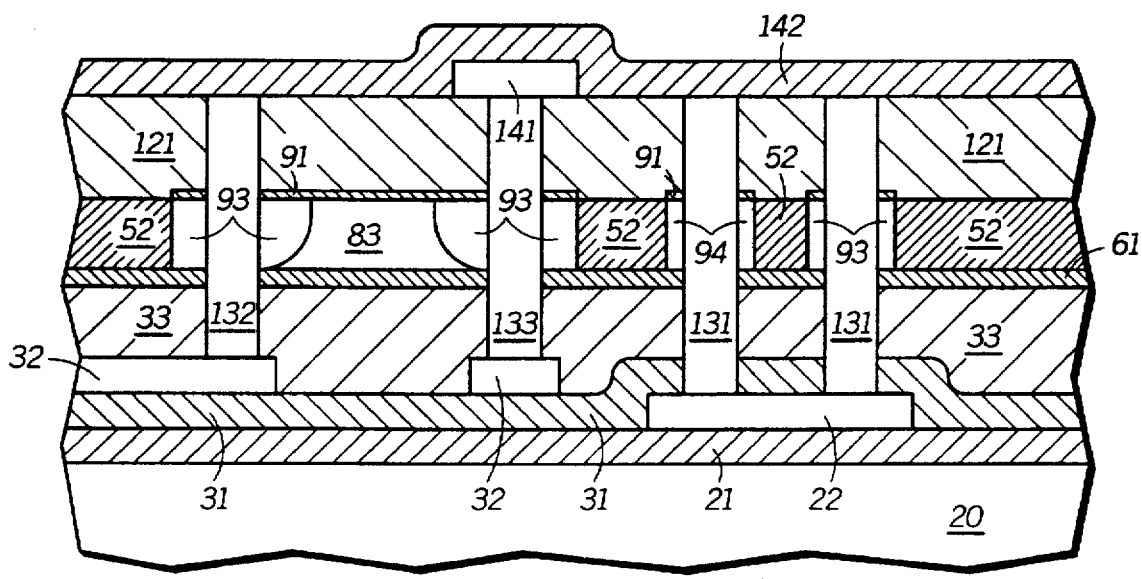
FIGS. 12–14 include illustrations of plan and cross-sectional views of the substrate of FIGS. 9, 10, an 11 after forming a substantially completed device.
Figure 12:
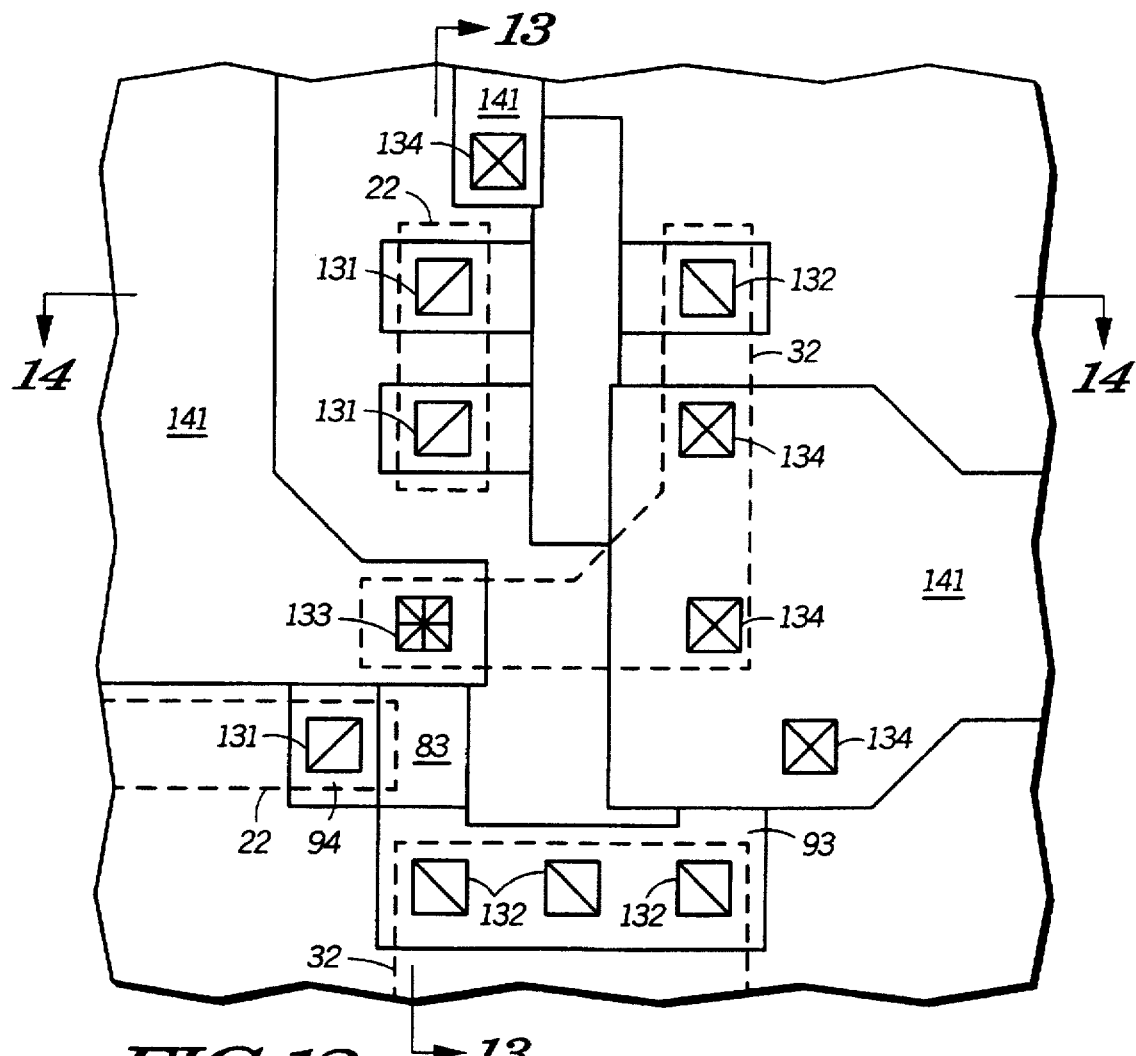
Figure 14:
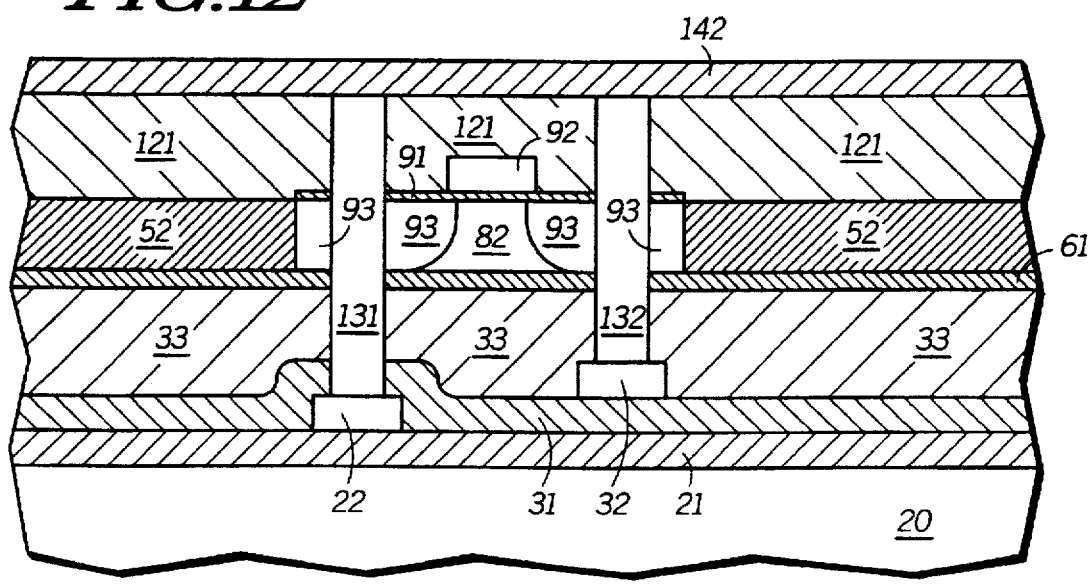

The substrate is further processed to form a substantially completed device as seen in FIGS. 12–14. An insulating layer 121 is formed over the conductive member 92, gate dielectric layer 91 and insulating layer 52. Openings are formed through the insulating layer 121. Some of the openings extend through portions of the semiconductor islands down to the interconnects 22 or 32. After openings are formed, conductive plugs 131–134 are formed to fill the openings. Third level interconnects 141 are formed over conductive plugs 133 and 134. A passivation layer 142 is formed over the interconnects 141.

The insulating layer 121 typically includes a doped oxide, such as borophosphosilicate glass (BPSG) phosphosilicate glass (PSG), and the like. Conductive plugs 131–134 typically include doped silicon, silicide, a metal, or a metal-containing material. The interconnects 141 are typically a metal or a metal-containing material. For example, the interconnects 141 include aluminum, copper, or any of the materials listed for the first-level and second-level interconnects 22 and 32.

FIG. 12 includes an illustration of a plan view of the device at this point in the processing. For simplicity, insulating layers and dielectric layers are not illustrated to better show the positional relationships of the various elements of the device. Interconnects 141 are illustrated with conductive plugs 133 and 134. Referring to the left interconnect 141, conductive plug 133 electrically connects the interconnect 141 to both one of the second-level interconnects 32 and the doped region 93 that is the emitter region of the bipolar transistor 14. Conductive plug 133 is illustrated by an asterisk within a square. This left interconnect 141 is coupled to a VSS electrode.

Conductive plugs 134 electrically connects some of the interconnects 141 to the conductive member 92 or doped regions within the semiconductor islands that are parts of active regions of transistors 11 and 13. Conductive plugs 134 are illustrated by a cross within a square. The interconnect 141 near the top center of FIG. 12 is IN1 for the device and is electrically connected to the conductive member 92. The right interconnect 141 is coupled to a VCC electrode. Conductive plugs 134 do not extend through any of the active regions.

Conductive plugs 131 are electrical contacts between first-level interconnects 22 and doped regions within the semiconductor islands that are parts of active regions of transistors 11, 12, and 14. Conductive plugs 131 are illustrated with a forward slash within a square. Conductive plugs 132 are electrical contacts between second-level interconnects 32 and doped regions within the semiconductor islands that are parts of active regions of transistors 12–14. Conductive plugs 132 are illustrated with a backward slash within a square. Within the device, portions of the active regions are connected with one another by three levels of interconnects that can be stacked over one another.

FIGS. 13 and 14 include illustrations of cross-sectional views of the device at sectioning lines 13—13 and 14—14, respectively, as shown in FIG. 12. FIG. 13 is at a location similar to FIG. 10, and FIG. 14 is at a location similar to FIG. 11. Conductive plugs 131 and 132 electrically connect portions of active regions with underlying interconnects 22 and 32. The interconnects 141 do not overlie the conductive plugs 131 and 132. Conductive plug 133 electrically connects one of the underlying interconnects 32, doped region 93 that is the emitter region for bipolar transistor 14, and interconnect 141 to one another. FIGS. 13 and 14 do not include a conductive plug 134, which is an electrical connection between the portions of the active regions or conductive member 92 and one of the interconnect 141. Referring to FIG. 13, the right interconnect 22 is part of an electrical connection between doped regions 93 and 94 that are the drain regions of transistors 12 and 11, respectively.

The conductive plugs 131–134 are a type of electrical connection between interconnects or between interconnects and doped regions. If the openings within the insulating layer 121 are large enough, the conductive plugs 131–134 are not needed. For example, a tungsten layer is deposited that fills the openings within the insulating layer 121. The tungsten layer would be patterned.

While the process forms conductive plugs similar to conductive plugs 131 and 132, single-piece interconnects replace the combinations of interconnects 141 and conductive plugs 133 and 134. In this embodiment, the interconnects that overlie the insulating layer 121 directly contact and are electrically connected to the underlying interconnects 22 and 32 and the active regions of the transistors. For example, aluminum is sputtered under high temperature and pressure conditions (relative to sputtering) and then reflowed into the contact openings. In addition, an adhesion or barrier layer may be formed with the openings of insulating layer 121 prior to depositing the layer for the single-piece interconnects. The adhesion or barrier layer is on the order of hundreds of angstroms and does not fill the openings.

In an alternate embodiment, the conductive plugs 131 and 132 may be formed prior to forming insulating layer 121. In still another embodiment, a conductive plug electrically connects only interconnects 22 and 32 to each other.

Within this device, both MOSFETs and bipolar transistors have been formed. Although no pnp bipolar transistors are shown, pnp bipolar transistors can be formed using the methods described herein. Therefore, one skilled in the art can form n-channel MOSFETs, p-channel MOSFETs, npn bipolar transistors, pnp bipolar transistors, resistors, capacitors, inductors or any combination thereof in accordance with the present invention.

Benefits

Interconnects that are buried within an insulating base material are used with an SOI type of device. In this manner, different levels of interconnects are used to increase the component density within the device. By proper design and layout of a device, the area occupied by the device is smaller than if buried interconnects were not used. If all interconnects were formed at over the insulating layer 121, the device area could be limited by minimum pitch requirements of design rules. Note that the interconnects at each level exceed the minimum pitch requirements because interconnects are at different elevations.

The device area is further reduced with the present invention because active regions are being electrically connected to interconnects that lie above and below the semiconductor islands. Assume that Metal 1 and Metal 2 interconnects are at two different elevations that are both above the semiconductor islands. Metal 1 could interfere with an electrical connection between Metal 2 and a semiconductor island meaning that the device area must be increased. The embodiments of present invention are less likely to have such a problem because interconnects are at elevations both above and below the semiconductor islands.

Another benefit of the embodiment previously described is better control over the thickness of the semiconductor islands 81–83 (active regions) that overlie the insulating layers 21, 31, 33, and 61. More specifically, the insulating layer 52 within the trenches is used as an endpoint detection for a dry etching or chemical-mechanical polishing step when forming the semiconductor islands 81–83. Compare this to a conventional prior art process that does not have any endpoint detection. Without endpoint detection, either a timed etch or timed polish must be used or the substrate must be periodically measured to determine the thickness of the SOI layer. Periodically measuring the thickness of the SOI layer is time consuming or does not give as much control as endpoint detection process would.

Still another benefit of the present invention is that it allows the active regions for the bipolar and MOSFETs to be formed with nearly vertical edges. If the thickness of the channel region of a MOSFET varies, the threshold voltage will likewise vary. For example, in a conventional local oxidation of silicon (LOCOS) field isolation process, the LOCOS field isolation regions typically cause the SOI layer to be locally thinner near the edge of the field isolation regions. This thinning of the SOI layer near the edge of the field isolation regions causes a relatively high sub-threshold leakage current. In other words, a MOSFET formed within an SOI layer adjacent to the LOCOS field isolation region is likely to have significant drain current even when potential on the MOSFET's gate electrode is below the MOSFET's threshold voltage (leakage current). High leakage current is undesired.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

I claim:

1. A process for forming a semiconductor-on-insulator device comprising the steps of:

providing a first substrate including a first insulating layer;

forming a first interconnect over the first insulating layer;

forming trenches within a second substrate having a first thickness and having a first conductivity type;

forming a second insulating layer within the trenches;

bonding the first and second substrates together such that the first and second insulating layers are adjacent to each other, wherein this step is performed after the step of forming the first interconnect; and removing a portion of the second substrate to expose portions of the second insulating layer thereby forming semiconductor islands.

2. The process of claim 1, further comprising a step of forming a doped region within the second substrate prior to the step of forming the second insulating layer.

3. The process of claim 1, wherein the step of removing includes:

polishing a first portion of the second substrate leaving a second portion of the substrate that is less than half as thick as the first thickness of the second substrate, and etching the second portion of the second substrate to expose portions of the second insulating layer.

4. The process of claim 1, further comprising steps of:

selectively doping at least one of the semiconductor islands to form a doped region; and forming an electrical connection between the doped region and the first interconnect.

5. The process of claim 1, further comprising a step of selectively doping portions of the semiconductor islands to form active regions of transistors that include a field effect transistor and a bipolar transistor.

6. The process of claim 1, further comprising steps of:

forming a third insulating layer over the first interconnect;

forming a second interconnect over the third insulating layer;

forming a fourth insulating layer over the second interconnect prior to the step of bonding;

forming a first doped region and a second doped region within at least one of the semiconductor islands; and forming a first electrical connection and a second electrical connection, wherein:

the first electrical connection is between the first doped region and an interconnect selected from a group consisting of the first and second interconnects; and the second electrical connection is between the second doped region, the first interconnect, and the second interconnect.

7. The process of claim 1, further comprising steps of:

forming a third insulating layer over the semiconductor islands; and forming a second interconnect over the third insulating layer such that the first and second interconnects are electrically connected to each other.

8. A process for forming a semiconductor-on-insulator device comprising the steps of:

providing a first substrate including a first insulating layer;

forming first interconnects over the first insulating layer;

forming a second insulating layer over the first interconnects;

forming second interconnects over the second insulating layer;

forming a third insulating layer over the second interconnects;

forming trenches within a second substrate having a first conductivity type;

forming a fourth insulating layer within the trenches;

bonding the first and second substrates together such that the third and fourth insulating layers are adjacent to each other;

removing a portion of the second substrate to expose portions of the fourth insulating layer thereby forming semiconductor islands;

forming active regions of transistors within the semiconductor islands; and forming electrical connections between the active regions and the first and second interconnects.

9. The process of claim 8, further comprising steps of:

forming a fifth insulating layer over the semiconductor islands;

forming third interconnects over the fifth insulating layer; and forming an electrical connection between at least one third interconnect and an interconnect selected from a group consisting of the first and second interconnects.

10. The process of claim 8, wherein the trenches are formed to a depth no deeper than 3000 angstroms.

11. The process of claim 8, further comprising steps of:

forming a fifth insulating layer over the active regions; and forming third interconnects over the fifth insulating layer, wherein at least one of the third interconnects is electrically connected to at least one of the active regions.

12. The process of claim 8, wherein the transistors include a field effect transistor and a bipolar transistor.

13. A process for forming a semiconductor-on-insulator device comprising the steps of:

providing a first substrate including a first insulating layer;

forming first interconnects over the first insulating layer;

forming trenches within a second substrate having a first conductivity type;

forming a second insulating layer within the trenches;

bonding the first and second substrates together such that the first and second insulating layers are adjacent to each other; wherein this step is performed after the step of forming the first interconnects;

removing a portion of the second substrate to expose portions of the second insulating layer thereby forming semiconductor islands;

forming active regions of transistors within the semiconductor islands;

forming a third insulating layer over the active regions; and forming second interconnects, wherein portions of the active regions are electrically connected to interconnects selected from a group consisting of the first and second interconnects.

14. The process of claim 13, wherein the first interconnects include a material selected from a group consisting of a silicide, tungsten, platinum, palladium, ruthenium, rhenium, osmium, iridium, and a conductive metal oxide.

15. The process of claim 13, wherein the trenches are formed to a depth no deeper than 3000 angstroms.

16. The process of claim 13, wherein the transistors include a field effect transistor and a bipolar transistor.

17. The process of claim 13, further comprising steps of:

forming a fourth insulating layer over the first interconnects;

forming third interconnects over the fourth insulating layer; and forming a fifth insulating layer over the third interconnects prior to the step of bonding, wherein:

at least one of the third interconnects is electrically connected to at least one of the first interconnects; and at least one of the third interconnects is electrically connected to at least one of the second interconnects.

18. The process of claim 13, wherein the first interconnects include a metal-containing material.

19. The process of claim 13, wherein the first interconnects include doped silicon.

20. The process of claim 1, wherein the first interconnect includes a metal-containing material.

21. The process of claim 1, wherein the first interconnect includes doped silicon.

22. The process of claim 1, wherein the first interconnect includes a material selected from a group consisting of doped silicon, a silicide, tungsten, platinum, palladium, ruthenium, rhenium, osmium, iridium, and a conductive metal oxide.

23. A process for forming a semiconductor-on-insulator device comprising the steps of:

providing a first substrate including a first insulating layer;

forming a first interconnect over the first insulating layer;

forming a second insulating layer over the first interconnect;

forming a second interconnect over the second insulating layer;

forming a third insulating layer over the second interconnect;

forming trenches within a second substrate having a first conductivity type;

forming a fourth insulating layer within the trenches;

bonding the first and second substrates together such that the third and fourth insulating layers are adjacent to each other;

removing a portion of the second substrate to expose portions of the fourth insulating layer thereby forming semiconductor islands;

forming a first doped region and a second doped region within at least one of the semiconductor islands; and forming a first electrical connection and a second electrical connection, wherein:

the first electrical connection is between the first doped region and an interconnect selected from a group consisting of the first and second interconnects; and the second electrical connection is between the second doped region, the first interconnect, and the second interconnect.

24. A process for forming a semiconductor-on-insulator device comprising the steps of:

providing a first substrate including a first insulating layer;

forming first interconnects over the first insulating layer;

forming a second insulating layer over the first interconnects;

forming second interconnects over the second insulating layer;

forming a third insulating layer over the second interconnects;

forming trenches within a second substrate having a first conductivity type;

forming a fourth insulating layer within the trenches;

bonding the first and second substrates together such that the third and fourth insulating layers are adjacent to each other;

removing a portion of the second substrate to expose portions of the fourth insulating layer thereby forming semiconductor islands;

forming active regions of transistors within the semiconductor islands;

forming a fifth insulating layer over the active regions; and forming third interconnects, wherein:

portions of the active regions are electrically connected to interconnects selected from a group consisting of the first and third interconnects;

at least one of the third interconnects is electrically connected to at least one of the first interconnects; and at least one of the third interconnects is electrically connected to at least one of the second interconnects.

* * * * *